(12) United States Patent
Shinya et al.

(10) Patent No.: US 7,757,626 B2
(45) Date of Patent: Jul. 20, 2010

(54) SUBSTRATE PROCESSING APPARATUS AND SUBSTRATE PROCESSING METHOD

(75) Inventors: Hiroshi Shinya, Koshi (JP); Shouichi Terada, Koshi (JP); Tsuyoshi Mizuno, Koshi (JP); Yukihiro Wakamoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 822 days.

(21) Appl. No.: 11/504,581

(22) Filed: Aug. 16, 2006

(65) Prior Publication Data

US 2007/0048449 A1    Mar. 1, 2007

(30) Foreign Application Priority Data

Aug. 26, 2005    (JP) .............................. 2005-246453

(51) Int. Cl.
B05C 11/02    (2006.01)
B05C 11/00    (2006.01)
B24B 29/00    (2006.01)

(52) U.S. Cl. .................... 118/101; 118/667; 118/59; 451/288

(58) Field of Classification Search ................ 118/101, 118/663–667, 52, 58–59; 451/288, 41; 428/411.1, 428/909; 156/345.1–345.55
See application file for complete search history.

(56) References Cited

U.S. PATENT DOCUMENTS

| | | | |
|---|---|---|---|
| 6,213,855 B1 * | 4/2001 | Natalicio | 451/364 |
| 6,416,384 B1 * | 7/2002 | Kawamoto et al. | 451/7 |
| 2001/0036749 A1 * | 11/2001 | Levert et al. | 438/758 |
| 2004/0185750 A1 * | 9/2004 | Kurogouchi | 451/5 |

FOREIGN PATENT DOCUMENTS

| | | |
|---|---|---|
| JP | 8-250493 | 9/1996 |
| JP | 9-27495 | 1/1997 |
| JP | 9-326394 | 12/1997 |
| JP | 2000-31138 | 1/2000 |

* cited by examiner

Primary Examiner—Yewebdar T Tadesse
(74) Attorney, Agent, or Firm—Oblon, Spivak, McClelland, Maier & Neustadt, L.L.P.

(57) ABSTRACT

In the present invention, a holding table incorporating a heater is provided, for example, in a treatment container of a planarization unit. A pressing plate having a lower surface formed flat is disposed above the holding table. The pressing plate is movable in the vertical direction and can lower to the holding table to press a resist film on the substrate from above. The pressing plate intermittently presses the upper surface of the resist film to planarize the upper surface while the heater is heating the substrate on the holding table at a predetermined temperature to dry the resist film. According to the present invention, a coating film applied on the substrate can be sufficiently planarized and dried.

11 Claims, 9 Drawing Sheets

SUBSTRATE PROCESSING APPARATUS AND SUBSTRATE PROCESSING METHOD

BACKGROUND OF THE INVENTION

1. Field of the Invention

The present invention relates to a method of processing a substrate on which a coating film is formed and a processing apparatus for the same.

2. Description of the Related Art

In a manufacturing process of a semiconductor device using a photolithography technology, for example, a treatment of forming an insulating film and a treatment of forming a resist film are performed. These treatments are typically performed by applying a coating solution composed of a film material in a liquid form onto a substrate and then evaporating a solvent in the coating film to dry the coating film.

In the manufacturing step of the semiconductor device having a complicated multilayer wiring structure, the coating solution is applied on a base film formed with a pattern and thus having irregularities. In this case, for example, the coating solution flows into portions of the base film with grooves on the wafer (substrate) W so that the film thickness of the portions with grooves is small, resulting in irregularities formed on the upper surface of the coating solution R as shown in FIG. 10. Further, in the case where the coating solution is applied to the substrate which is being rotated, for example, for an SOG film and an SOD film, the portion of the film near the periphery of the substrate affected by a stronger centrifugal force rises higher than the portion of the film near the central portion of the substrate. When the coating film R is dried, the coating film R shrinks due to evaporation of a solvent therein. The shrinkage percentage of the coating film R is different on the base film between the portion with the grooves and the portion without grooves, which difference also forms irregularities on the upper surface of the coating film R.

Formation of the irregularities on the upper surface of the coating film as described above causes, for example, partial defocusing at the time of exposure, leading to variations in line width of the pattern to be formed on the coating film. Further, at the time of etching, the depth of the groove formed by the etching is, different between the rising portion and the recessed portion on the upper surface of the coating film, with the result that metal wires embedded in the grooves have nonuniform depths to cause uneven electric resistances, failing to form an appropriate semiconductor device.

To planarize the coating film, for example, for an insulating film, processing is performed in which the surface of the coating film is polished by the CMP (Chemical Mechanical Polishing) technique after the formation of the film. However, in this case, a lot of time is required for the CMP processing, resulting in decreased throughput. Further, a CMP device is also necessary, which accordingly increases the cost.

Other than the aforementioned CMP technique, other planarization methods have been proposed, such as a planarization technique of planarizing the coating film by a roller (Japanese Patent Application Laid-open No. 2000-31138), a planarization technique of laying a thin film on the coating film and pressurizing the thin film (Japanese Patent Application Laid-open No. H 9-27495), and so on, but any of them has not attained a sufficient flatness.

SUMMARY OF THE INVENTION

The present invention has been developed in consideration of the above viewpoints, and its object is to sufficiently planarize a coating film applied on a substrate.

To achieve the above object, the present invention is a method of processing a substrate on which a coating film is formed by application of a coating solution, including a drying step of drying the coating film by evaporating a solvent in the coating film on the substrate; and a pressing step of intermittently pressing an upper surface of the coating film by a pressing member having a flat lower surface during the drying step.

According to the present invention, the pressing member intermittently presses an upper surface of the coating film during the drying step of the coating film, so that the upper surface of the coating film can be sufficiently planarized by a plurality of times of press before the coating film becomes dried. Further, since the upper surface of the coating film is intermittently pressed during drying, irregularities formed due to shrinkage of the coating film during drying can be flattened when the difference in level of the irregularities is still small. As a result, a coating film with a flatness higher than that in the prior art can be formed.

According to another aspect, the present invention is a method of processing a substrate on which a coating film is formed by application of a coating solution, including a drying step of drying the coating film by evaporating a solvent in the coating film on the substrate; and a pressing step of intermittently pressing an upper surface of the coating film by a pressing member during the drying step, the pressing step having a process of pressing the upper surface of the coating film by a pressing member having an apex portion protruding downward on a lower surface thereof, and then pressing the upper surface of the coating film by a pressing member having a flat lower surface.

According to still another aspect, the present invention is a processing apparatus for a substrate on which a coating film is formed by application of a coating solution, including a holding member for holding the substrate thereon in a treatment container; a heating member for heating the substrate held on the holding member; a pressing member having a lower surface formed flat, for pressing the coating film on the substrate from above; and a controller for controlling operations of the heating member and the pressing member so that the pressing member intermittently presses an upper surface of the coating film on the substrate heated by the heating member.

According to yet another aspect, the present invention is a processing apparatus for a substrate on which a coating film is formed by application of a coating solution, including a holding member for holding the substrate thereon in a treatment container; a heating member for heating the substrate held on the holding member; a plurality of pressing members for pressing the coating film on the substrate from above; and a controller for controlling operations of the heating member and the pressing members so that the pressing members intermittently press an upper surface of the coating film on the substrate heated by the heating member. Further, the plurality of pressing members include a pressing member having an apex portion protruding downward on a lower surface thereof and a pressing member having a flat lower surface, and the controller conducts control such that the pressing member having an apex portion presses the upper surface of the coating film on the substrate and then the pressing member having a flat lower surface presses the upper surface of the coating film.

According to further another aspect, the present invention is a processing apparatus for a substrate on which a coating film is formed by application of a coating solution, including a holding member for holding the substrate thereon in a treatment container; a pressure reducing unit for reducing a pressure in the treatment container; a pressing member having a lower surface formed flat, for pressing the coating film on the substrate held on the holding member from above; and a controller for controlling operations of the pressure reducing unit and the pressing member such that the pressing member intermittently presses an upper surface of the coating film on the substrate while the pressure reducing unit is reducing the pressure in the treatment container.

According to further still another aspect, the present invention is a processing apparatus for a substrate on which a coating film is formed by application of a coating solution, including a holding member for holding the substrate thereon in a treatment container; a pressure reducing unit for reducing a pressure in the treatment container; a plurality of pressing members for pressing the coating film on the substrate held on the holding member from above; and a controller for controlling operations of the pressure reducing unit and the pressing members such that the pressing members intermittently press an upper surface of the coating film on the substrate while the pressure reducing unit is reducing the pressure in the treatment container. Further, the plurality of pressing members include a pressing member having an apex portion protruding downward on a lower surface thereof and a pressing member having a flat lower surface, and the controller conducts control such that the pressing member having an apex portion presses the upper surface of the coating film on the substrate and then the pressing member having a flat lower surface presses the upper surface of the coating film.

According to the present invention, the coating film is sufficiently planarized, so that exposure processing and etching treatment are uniformly performed within the substrate surface, whereby appropriate substrate products are manufactured.

DETAILED DESCRIPTION OF THE PREFERRED EMBODIMENT

Figure 1:
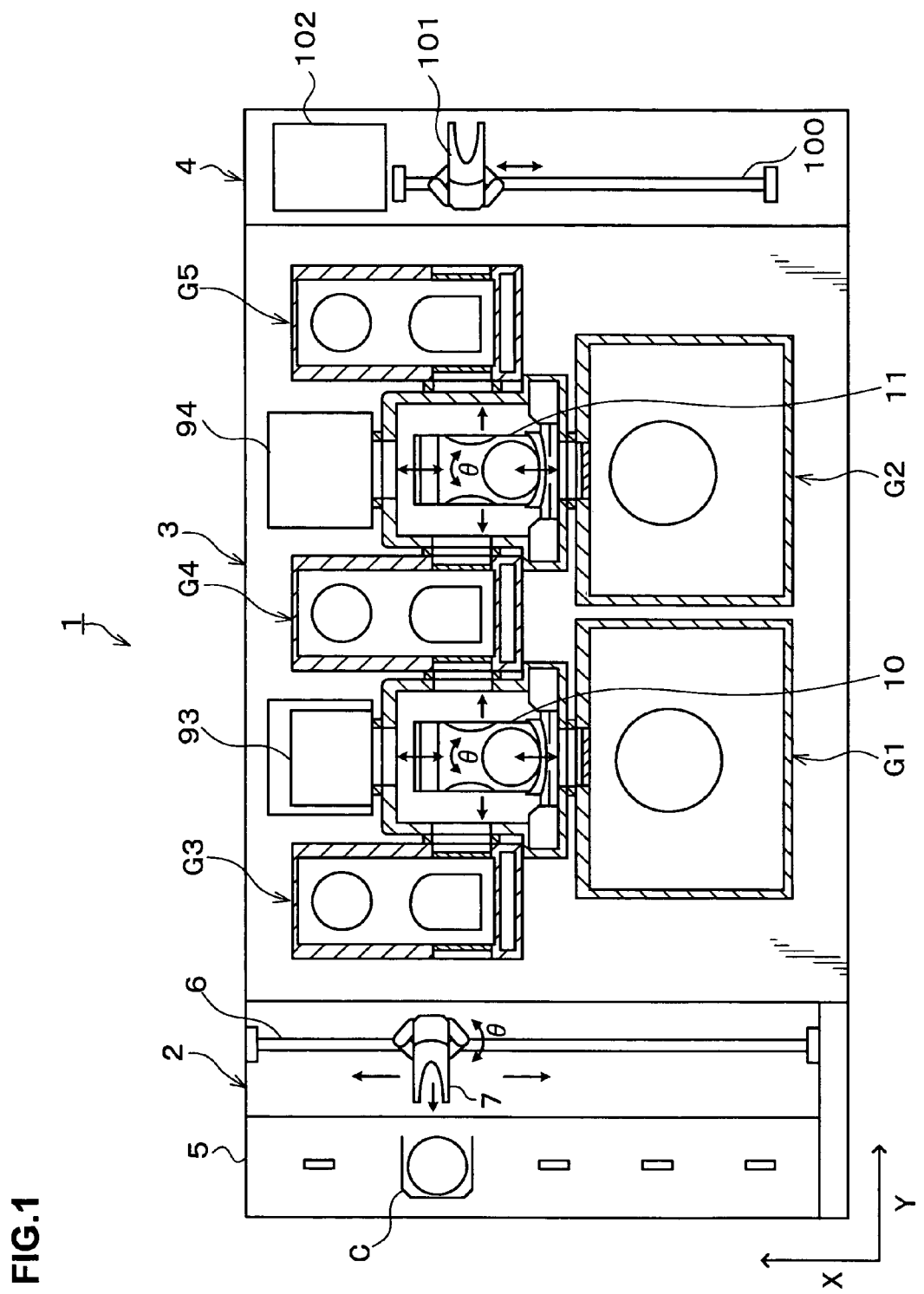
FIG. 1 is a plan view showing the outline of a configuration of a coating and developing treatment system.
Figure 2:
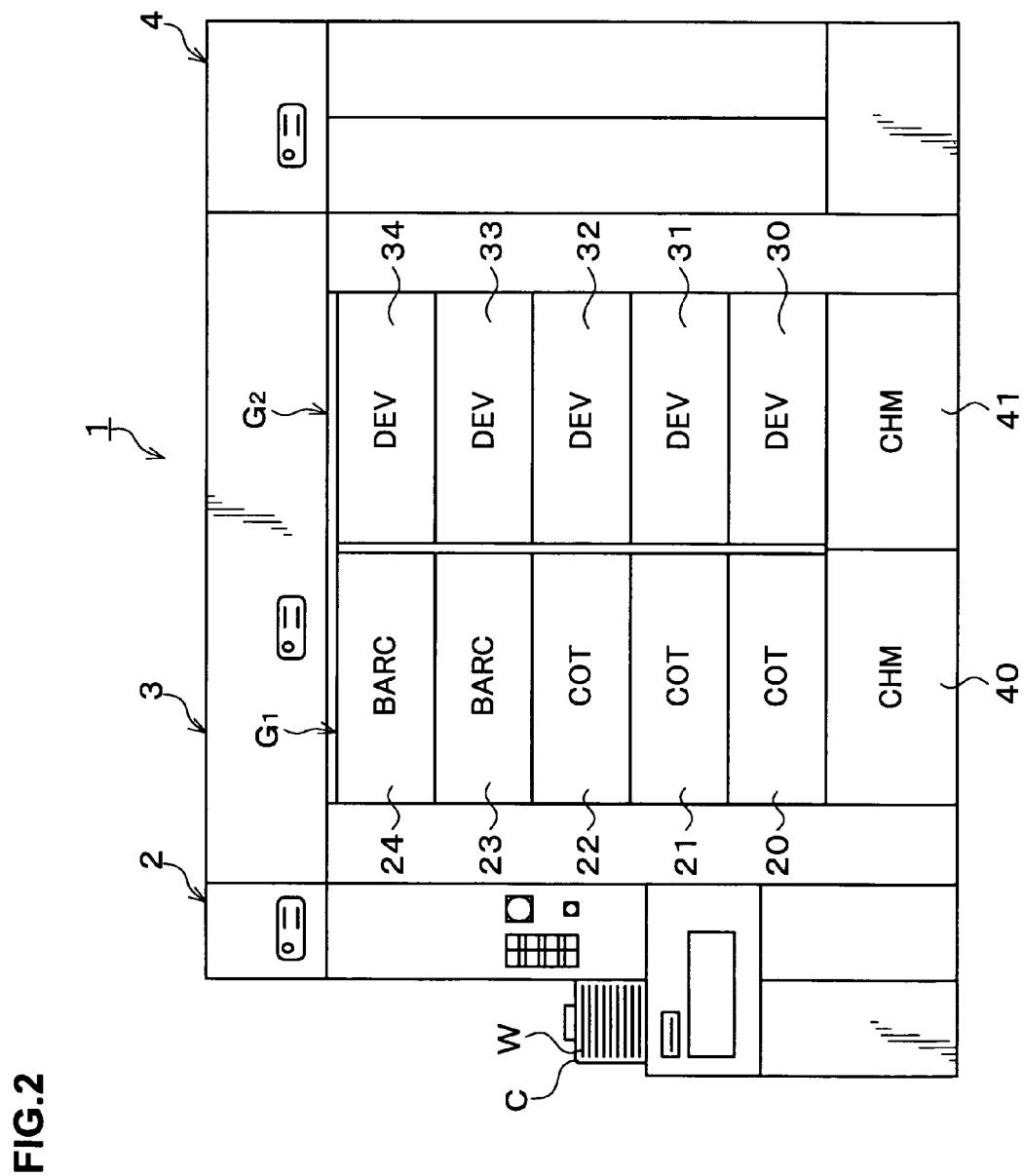
FIG. 2 is a front view of the coating and developing treatment system in FIG. 1.
Figure 3:
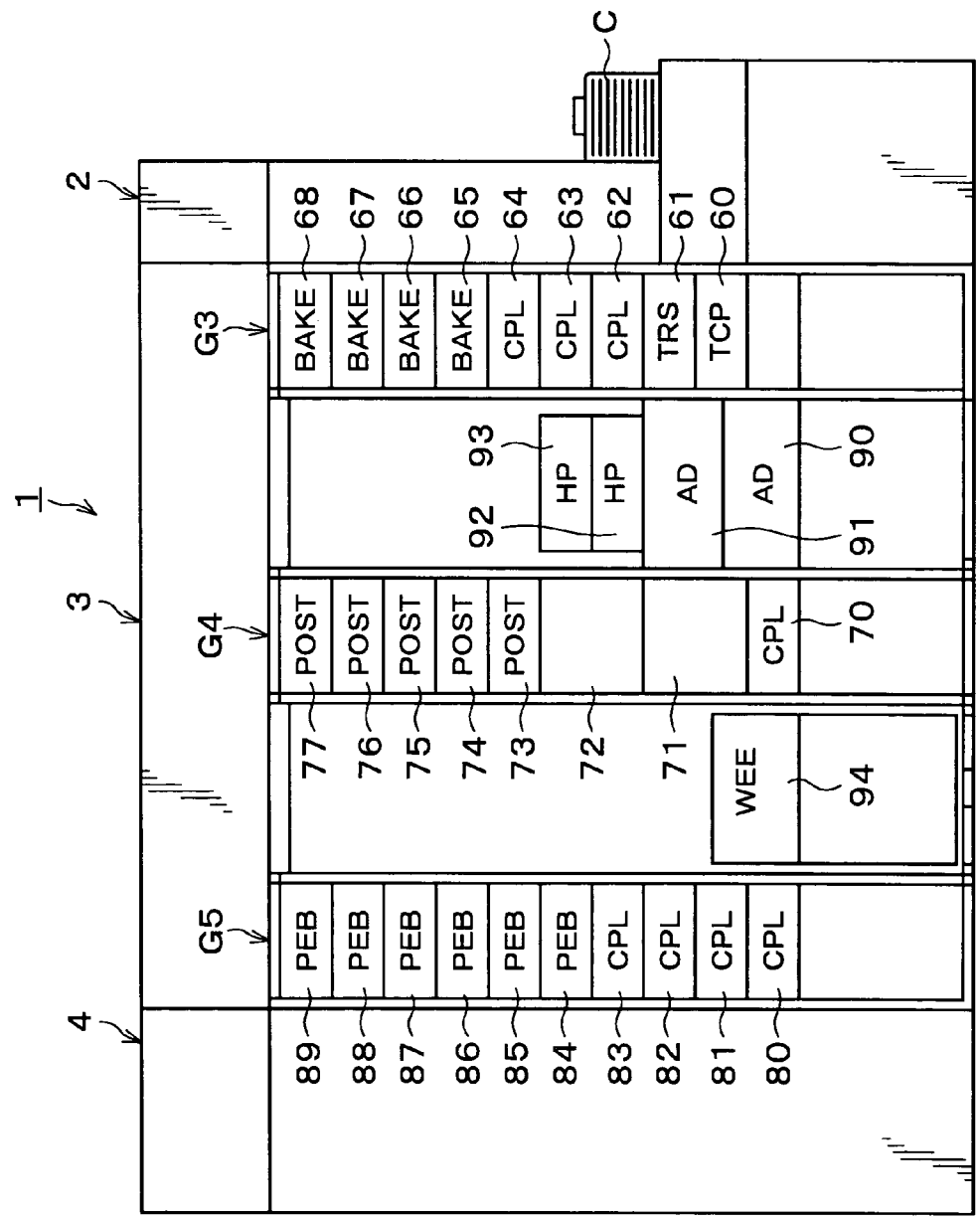
FIG. 3 is a rear view of the coating and developing treatment system in FIG. 1.

Hereinafter, preferred embodiments of the present invention will be described. FIG. 1 is a plan view showing the outline of a configuration of a coating and developing treatment system 1 in which a planarization unit as a substrate processing apparatus according to the embodiment is provided, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for transferring the wafers W to/from a not-shown aligner provided adjacent to the processing station 3, are integrally connected together.

In the cassette station 2, a cassette mounting table 5 is provided and configured such that a plurality of cassettes C can be mounted on the cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a θ-direction around the Z-axis, can access a later-described temperature regulating unit 60 and a transition unit 61 included in a third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heat-processing the wafer W at a high temperature, are nine-tiered in order from the bottom.

In the fourth processing unit group G4, for example, a high-precision temperature regulating unit 70, planarization units 71 and 72 according to this embodiment and post-baking units 73 to 77 each for heat-processing the wafer W after developing treatment, are eight-tiered in order from the bottom. Note that the configuration of the planarization units 71 and 72 will be described later.

In the fifth processing unit group G5, a plurality of thermal processing units each for performing thermal processing for the wafer W, for example, high-precision temperature regulating units 80 to 83, and post-exposure baking units 84 to 89 each for heat-processing the wafer W after exposure, are ten-tiered in order from the bottom.

A plurality of processing and treatment units are arranged on the positive direction side in the X-direction of the first carrier unit 10 as shown in FIG. 1, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and thus can access the not-shown aligner adjacent to the interface section 4, the buffer cassette 102, and the fifth processing unit group G5 and carry the wafer W to them.

Figure 4:
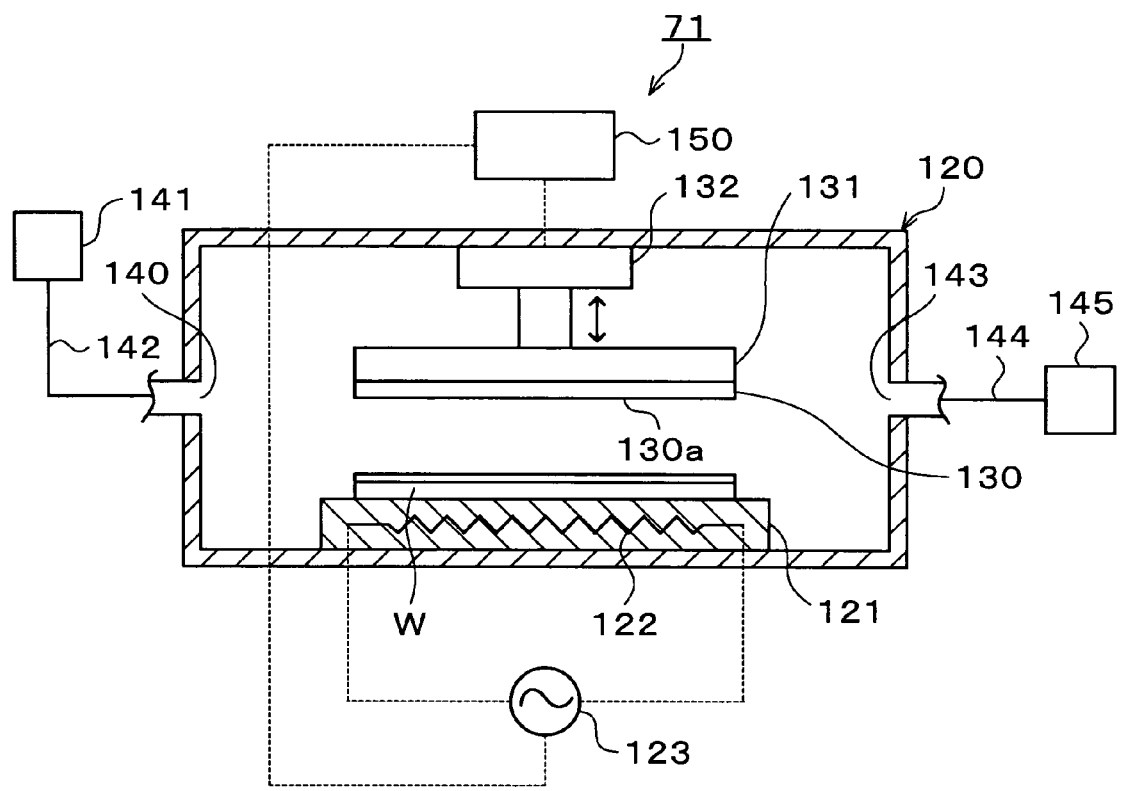
FIG. 4 is an explanatory view of a longitudinal section showing the outline of a configuration of a planarization unit.

Next, the configuration of the planarization unit 71 will be described. FIG. 4 is an explanatory view of a longitudinal section showing the outline of the configuration of the planarization unit 71.

The planarization unit 71 has a treatment container 120 whose inside can be hermetically closed. At the central portion of the treatment container 120, for example, a holding table 121 is provided as a holding member for mounting and holding the wafer W thereon. The holding table 121 is formed, for example, in an almost disk shape. In the upper surface of the holding table 121, a not-shown suction port is open so that suction via the suction port allows the wafer W to be suction held. Inside the holding table 121, for example, a heater 122 as a heating member is embedded. The heater 122 can generate heat by power feeding from a power supply 123 to heat the wafer W on the holding table 121.

A pressing plate 130 as a pressing member is provided above the holding table 121 in a manner to face the holding table 121. The pressing plate 130 is formed, for example, in an almost disk shape at least larger than the wafer W, with a lower surface 130a formed flat. As the material of the pressing plate 130, for example, glass or nickel is used. The lower surface 130a of the pressing plate 130 has been subjected to surface treatment for preventing adhesion with, for example, a resist film. Note that, in place of the surface treatment, a release agent may be applied to the lower surface 130a.

The pressing plate 130 is supported by a support body 131 on its upper surface side. The support body 131 can be raised and lowered, for example, by a raising and lowering drive unit 132 such as a cylinder attached to the ceiling surface of the treatment container 120. This allows the pressing plate 130 to lower to the front surface of the wafer W on the holding table 121 and press the upper surface of the resist film on the wafer W.

In a side wall surface on one side of the treatment container 120, a gas supply port 140 is formed which supplies a vapor of the solvent for the resist solution. To the gas supply port 140, for example, a solvent vapor supply pipe 142 is connected which leads to a solvent vapor supply unit 141. In a side wall surface on the other side of the treatment container 120, an exhaust port 143 is formed. The exhaust port 143 is connected to a negative pressure generator 145, for example, via an exhaust pipe 144. The negative pressure generator 145 can exhaust the atmosphere in the treatment container 120 from the exhaust port 143. Note that the exhaust port 143, the exhaust pipe 144, and the negative pressure generator 145 constitute a pressure reducing device in this embodiment.

For example, the operations of the above-described pressing plate 130 and the heater 122 are controlled by a controller 150. The controller 150 adjusts the amount of power feeding from the power supply 123 to the heater 122 to control the heating value of the heater 122, whereby the wafer W can be heated at a predetermined temperature. The controller 150 can control drive of the raising and lowering drive unit 132 and control movement of the pressing plate 130 to press the resist film on the wafer W at a predetermined timing at a predetermined pressure through use of the pressing plate 130.

For example, the operations of the above-described solvent vapor supply unit 141 and the negative pressure generator 145 are also controlled by the controller 150. The controller 150 allows the solvent vapor to be supplied at a predetermined flow rate into the treatment container 120. In addition, the controller 150 can reduce the pressure in the treatment container 120 to a predetermined pressure. The configuration of the planarization unit 72 is the same as that of the planarization unit 71 and thus description thereof will be omitted.

Next, the processing process of the wafer W in the planarization unit 71 configured as described above will be described together with the process of the photolithography process performed in the coating and developing treatment system 1.

First of all, one unprocessed wafer W is taken out of the cassette C on the cassette mounting table 5 by the wafer carrier 7 and carried to the temperature regulating unit 60 included in the third processing unit group G3. The wafer W carried to the temperature regulating unit 60 is temperature-regulated to a predetermined temperature, and is then carried by the first carrier unit 10 into the bottom coating unit 23 where an anti-reflection film is formed on the wafer W. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, the wafer W is carried to the resist coating unit 20.

In the resist coating unit 20, a resist solution as a coating solution is dripped, for example, onto the central portion of the rotated wafer W so that the resist solution spreads over the front surface of the wafer W, whereby the resist solution is applied on the entire wafer surface. After the application of the resist solution, the wafer W is rotated at a high speed so that the resist solution is dried to a drying degree of, for example, about 60%. The wafer W for which application of the resist solution has been finished in the resist coating unit 20 is carried to the planarization unit 71 where the wafer W is subjected to drying and planarization. The processing process in the planarization unit 71 will be described later.

The wafer W having the resist film planarized in the planarization unit 71 is carried by the second carrier unit 11 to the edge exposure unit 94 and the high-precision temperature regulating unit 83 in sequence so that the wafer W is subjected to predetermined processing in each of the units. Thereafter, the wafer W is carried by the wafer carrier 101 in the interface section 4 to the not-shown aligner where the wafer is exposed to light. The wafer W for which exposure processing has been finished is carried by the wafer carrier 101 to the post-exposure baking unit 84 where the wafer W is subjected to heat-processing, and then carried by the second carrier unit 11 to the high-precision temperature regulating unit 81 where the wafer W is temperature-regulated. The wafer W is then carried to the developing treatment unit 30 where the resist film on the wafer W is developed. The wafer W is then carried by the second carrier unit 11 to the post-baking unit 73 where the wafer W is subjected to heat-processing, and is then carried to the high-precision temperature regulating unit 63 where the wafer W is temperature-regulated. The wafer W is then carried by the first carrier unit 10 to the transition unit 61 and returned to the cassette C by the wafer carrier 7, thus completing a series of steps of the photolithography process.

Next, the processing performed in the above-described planarization unit 71 will be described in detail. In the resist coating unit 20 at the immediately preceding stage, the resist film has been dried to a drying degree of about 60% by the high speed rotation of the wafer W. Note that the initial drying may be performed in the planarization unit 71. As shown in FIG. 4, the wafer W is carried into the treatment container 120 of the planarization unit 71 and suction held on the holding table 121.

For example, gas supply of the solvent vapor from the gas supply port 140 and exhaust gas from the exhaust port 143 are performed in the treatment container 120, so that a solvent atmosphere at a predetermined concentration is maintained in the treatment container 120. Inside the treatment container 120, a predetermined reduced pressure atmosphere is maintained.

Figure 5:
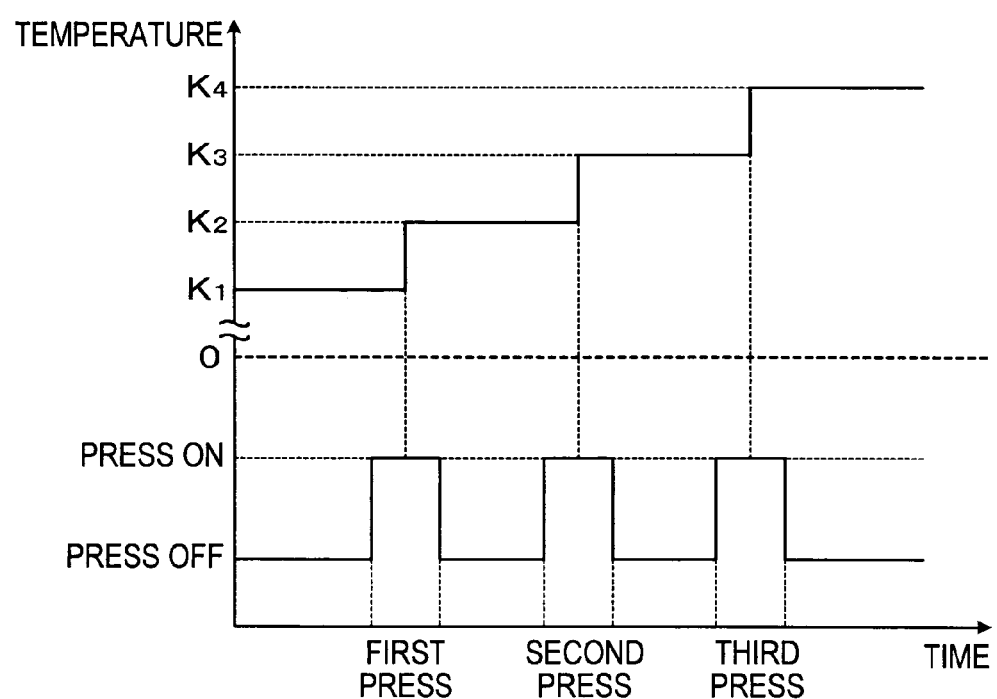
FIG. 5 is a graph showing the variation in time series in heating temperature and press timings.

When the wafer W is held on the holding table 121, the wafer W is heated by the heater 122 so that the resist film is dried and the upper surface of the resist film is intermittently pressed by the pressing plate 130. The wafer W in this event is heated such that the heating temperature gradually increases. FIG. 5 is a graph showing the variation in time series in the heating temperature of the wafer W and examples of the timing of pressing the resist film.

Figure 6A:
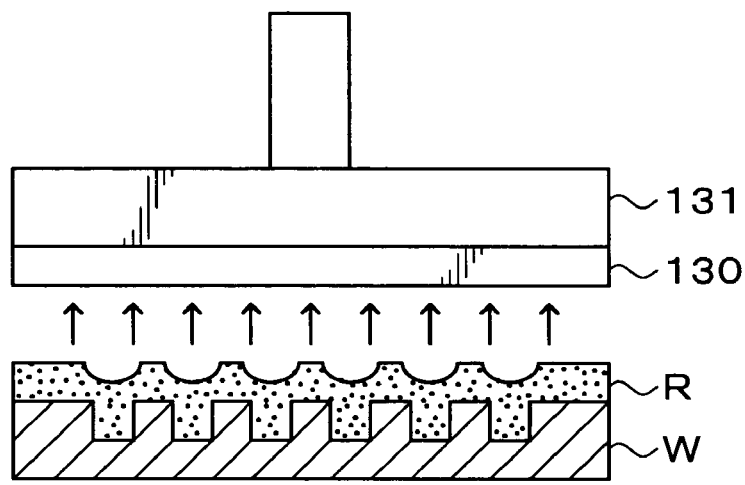
FIGS. 6A and 6B are explanatory views showing an appearance when a pressing plate is separated from a resist film and an appearance when the pressing plate is pressed against the resist film.

For example, as shown in FIG. 5, the wafer W is first heated at a first stage temperature $K_1$, that is a relatively low temperature, for example, 120° C. At this time, irregularities are formed on the upper surface of a resist film R as shown in FIG. 6A. One of conceivable reasons of formation of the irregularities is that the resist solution was applied onto a base film with irregularities in the resist coating treatment. Another conceivable reason is that the resist film is pushed away outward on the wafer W due to the centrifugal force at the time of resist coating. Still another conceivable reason is that as the resist film progresses in drying by evaporation of the solvent therein, the resist film accordingly shrinks, and since the shrinkage percentage of the resist film in the vertical direction is different on the base film between a portion thereof with grooves and another portion without grooves, the resist solution on the portion with the grooves dents with respect to the resist film on other portion.

Figure 6B:
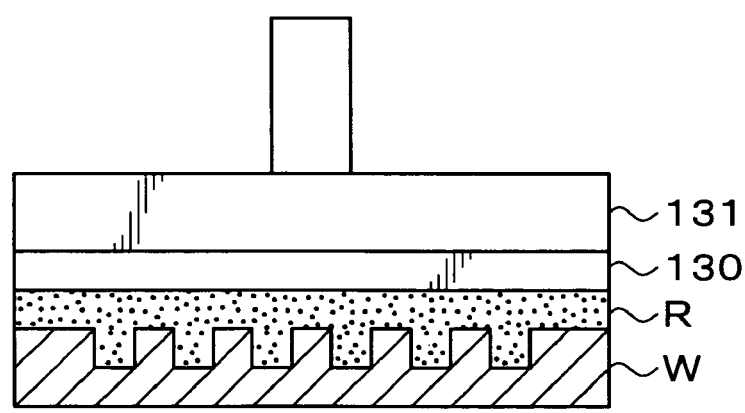

While the wafer W is being heated at 120° C., the pressing plate 130 is then lowered as shown in FIG. 6B whereby the upper surface of the resist film R is pressed by the lower surface 130*a* of the pressing plate 130 ("a first press" shown in FIG. 5). This planarizes the irregularities on the upper surface of the resist film R. The press by the pressing plate 130 is performed at a pressure of, for example, about $4.9 \times 10^2$ kPa (5 kgf/cm$^2$), for example, for about two seconds. During the press, for example, the heating temperature of the wafer W is changed such that the heating temperature is raised, for example, to a second stage temperature $K_2$ higher than the preceding first stage temperature $K_1$, for example, to 130° C.

The pressing plate 130 is then raised away from the resist film, whereby the upper surface of the resist film is open. The wafer W is heated at 130° C. so that the solvent in the resist film R evaporates and the resist film R further progresses in drying as shown in FIG. 6A. In this event, shrinkage of the resist film R forms again irregularities on the upper surface of the resist film R.

After drying with heating at 130° C. is continued for a predetermined time, for example, about two seconds, the pressing plate 130 is lowered again as shown in FIG. 6B, whereby the upper surface of the resist film R is pressed to be planarized ("a second press" shown in FIG. 5). During the press, for example, the heating temperature of the wafer W is also raised, for example, to a third stage temperature $K_3$ higher than the preceding second stage temperature $K_2$, for example, to 140° C. After the change of the heating temperature, the pressing plate 130 is raised as shown in FIG. 6A, whereby the upper surface of the resist film R is open. The wafer W is heated at 140° C. so that the solvent in the resist film R evaporates and the resist film R further progresses in drying. After a lapse of a predetermined time, when irregularities form again on the upper surface of the resist film R, the pressing plate 130 is lowered as shown in FIG. 6B, whereby the upper surface of the resist film R is pressed to be planarized ("a third press" shown in FIG. 5). During the press, the heating temperature of the wafer W is raised, for example, from the preceding third stage temperature $K_3$ to a fourth stage temperature $K_4$ that is the final heating temperature, for example, to 150° C. At this time the resist film R is dried to a drying degree of about 80%.

As shown in FIG. 6A, the pressing plate 130 is raised, the wafer W is heated at 150° C. for a predetermined time so that the resist film R is dried to a drying degree of 100%. After the drying, the wafer W is carried out from the treatment container 120, thus completing a series of steps in the planarization processing.

Note that the above-described series of steps in the planarization processing is realized, for example, by the controller 150 controlling the operations of the pressing plate 130, the heater 122, the solvent vapor supply unit 141, the negative pressure generator 145 and so on.

According to the above embodiment, the pressing plate 130 intermittently presses the upper surface of the resist film while the solvent in the resist film is evaporating to dry the resist film, so that the irregularities on the upper surface of the resist film can be planarized before it is dried. Further, since the a plurality of presses are performed intermittently onto the upper surface of the resist film, the irregularities of the resist film can be flattened at the stage when the irregularities of the resist film formed at the drying time are still small, resulting in formation of a sufficiently polarized resist film.

Since the upper surface of the resist film is pressed when the drying degree of the resist film is within 60% to 80%, the resist film can be flattened when the resist film is in a suitable state having a viscosity not too low and not too high. As a result, the resist film can be effectively flattened, whereby a sufficiently planarized resist film can be finally formed.

Since the resist film is dried by heating, the flowability of the resist film itself can be increased due to thermal diffusion. This increases the flowability of the resist film when it is pressed and thereby effectively performs planarization of the resist film.

Gradually raising the heating temperature can prevent rapid drying of the resist film and restrain formation of irregularities with a large difference in level on the surface of the resist film. This allows a plurality of presses to sufficiently planarize the resist film.

During the time when the resist film is being pressed by the pressing plate 130, the pressing plate 130 is in close contact with the upper surface of the resist film, and therefore the solvent in the resist film does not evaporate. Since the heating temperature is changed during the press time but is not changed during the evaporation of the solvent, the temperature at the time of drying the resist film is stabilized. This facilitates control of the drying degree and the viscosity of the resist film.

The vapor of the solvent for the resist film is supplied into the treatment container 120, so that the evaporation speed of the solvent in the resist film can be decreased while the upper surface of the resist film is being pressed intermittently. This makes it possible to decrease the evaporation speed of the solvent with the flowability of the resist film being increased by heating, to thereby keep the viscosity of the resist film low. As a result, the resist film becomes easy to deform due to press by the pressing plate 130 so that the resist film is sufficiently planarized by the press.

Since the atmosphere in the treatment container 120 is exhausted, the concentration of the solvent vapor in the treatment container 120 can be maintained at a desired concentration to appropriately adjust the drying speed and the viscosity of the resist film.

Figure 7:
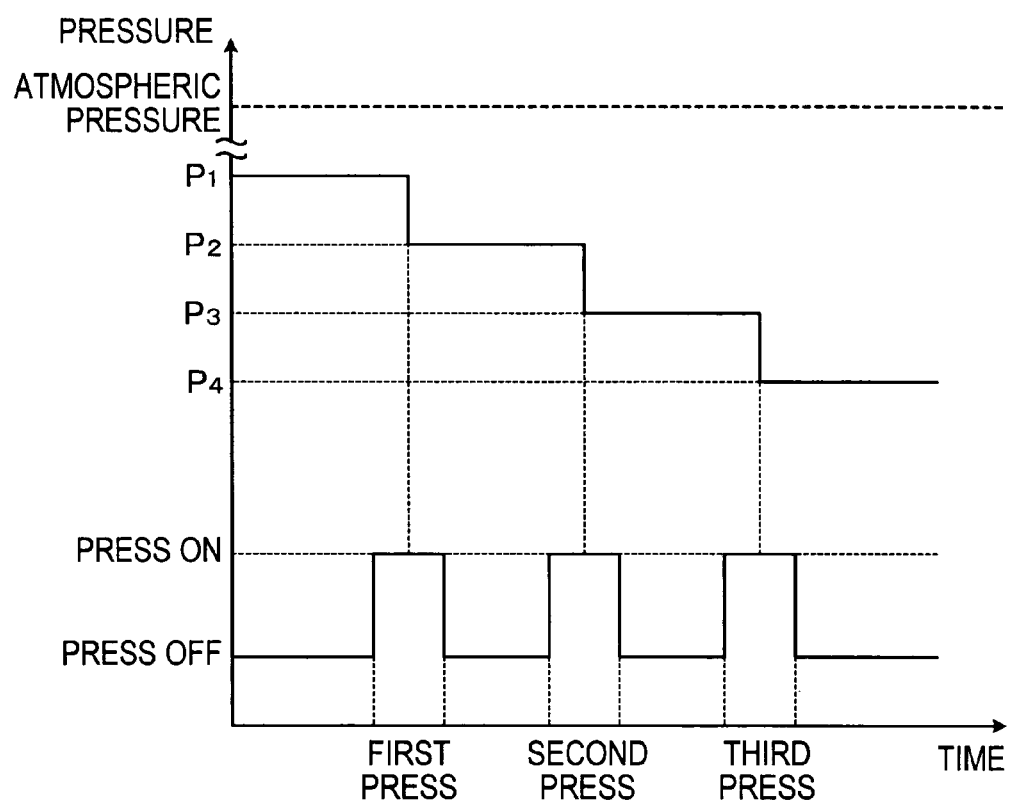
FIG. 7 is a graph showing the variation in time series in pressure in a treatment container and press timings.

While the heating temperature of the wafer W is gradually raised in the above embodiment, the pressure reduction degree in the treatment container 120 may be gradually increased (the pressure being gradually decreased). FIG. 7 is a graph showing the variation in time series of the pressure in the treatment container 120 and examples of the timing of pressing the resist film in this case.

As shown in FIG. 7, the pressing plate 130 intermittently presses the upper surface of the resist film while the pressure in the treatment container 120 is being reduced to dry the resist film. The pressure in the treatment container 120 is decreased to a first stage pressure $P_1$ (for example, 500 Pa), a second stage pressure $P_2$ (for example, 450 Pa), a third stage pressure $P_3$ (for example, 400 Pa), and a fourth stage pressure $P_4$ (for example, 300 Pa) in this order. The variation in pressure is performed, for example, by the controller 150 controlling the output of the negative pressure generator 145, for example, while the upper surface of the resist film is being pressed.

Also in this case, the upper surface of the resist film can be intermittently flattened while the solvent in the resist film is evaporating and the resist film gradually progress in drying as in the above-described embodiment. As a result, a resist film with a high flatness can be finally formed.

Note that while either the heating temperature of the wafer W or the pressure reduction degree in the treatment container 120 is gradually changed in the above embodiment, both of them may be gradually changed. Further, the number of times of presses by the pressing plate 130 is not limited to three but may be arbitrarily selected.

Figure 8:
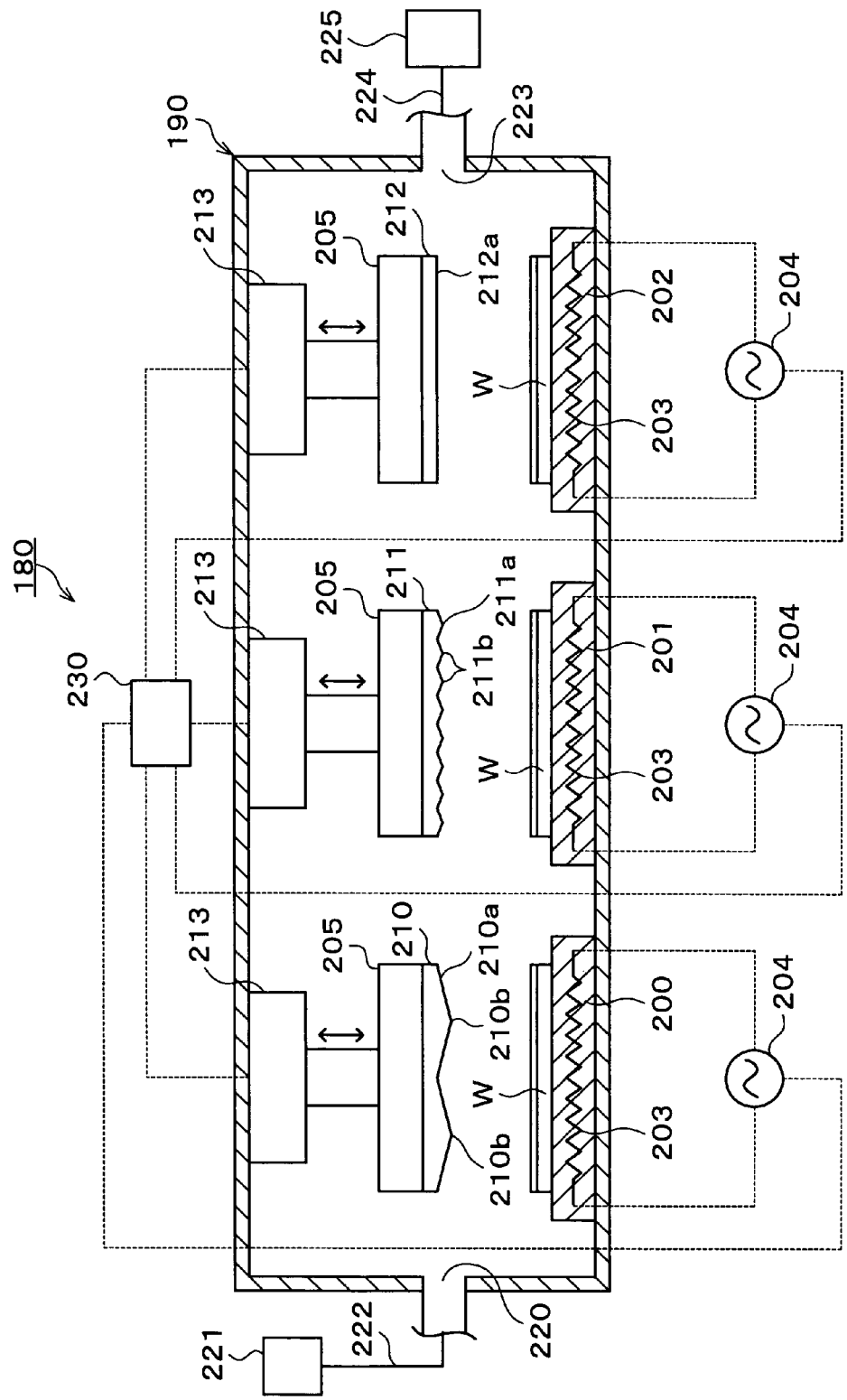
FIG. 8 is an explanatory view of a longitudinal section showing the outline of a configuration of a planarization unit incorporating three kinds of pressing plates.

While the upper surface of the resist film is pressed by the pressing plate 130 having the flat lower surface 130a according to the above embodiment, the upper surface of the resist film may be pressed by a pressing plate having a lower surface with apex portions protruding downward. FIG. 8 shows an example of such a planarization unit 180.

In a treatment container 190 of the planarization unit 180, for example, three holding tables 200, 201, and 202 are provided, arranged side by side in this order. In the holding tables 200 to 202, respective heaters 203 are embedded as in the above-described embodiment. The heaters 203 generate heat by feeding from respective power supplies 204. Pressing plates 210, 211, and 212 supported by support bodies 205 are disposed above the respective holding tables 200 to 202. The support bodies 205 can be raised and lowered by respective raising and lowering drive units 213.

For example, a lower surface 210a of the pressing plate 210 facing the holding table 200 is formed with apex portions 210b protruding downward in the shape of an inverted triangle. A lower surface 211a of the pressing plate 211 facing the holding table 201 is also formed with apex portions 211b protruding downward in the shape of an inverted triangle. The apex portions 211b of the pressing plate 211 are formed having a protrusion height smaller than that of the apex portions 210b of the pressing plate 210 and formed such that irregularities on the lower surface 211a of the pressing plate 211 are finer than those on the lower surface 210a of the pressing plate 210. In other words, the lower surface 211a of the pressing plate 211 is formed to have a higher flatness than that of the lower surface 210a of the pressing plate 210.

A lower surface 212a of the pressing plate 212 facing the holding table 202 is formed flat. As described above, the three pressing plates are arranged side by side in the order of increasing the flatness of the lower surface.

In a side wall surface on one side of the treatment container 190, a gas supply port 220 is formed which supplies a vapor of the solvent for a resist solution as in the above-described embodiment. To the gas supply port 220, for example, a solvent vapor supply pipe 222 is connected which leads to a solvent vapor supply unit 221. In a side wall surface on the other side of the treatment container 190, an exhaust port 223 is formed. The exhaust port 223 is connected to a negative pressure generator 225, for example, via an exhaust pipe 224.

The operations of the above-described pressing plates 210 to 212, the heaters 203, the solvent vapor supply unit 221, the negative pressure generator 225 and so on are controlled by a controller 230.

Note that a not-shown carrier mechanism is provided in the treatment container 190 which carries the wafer W between the holding tables 200, 201 and 202.

Figure 9:
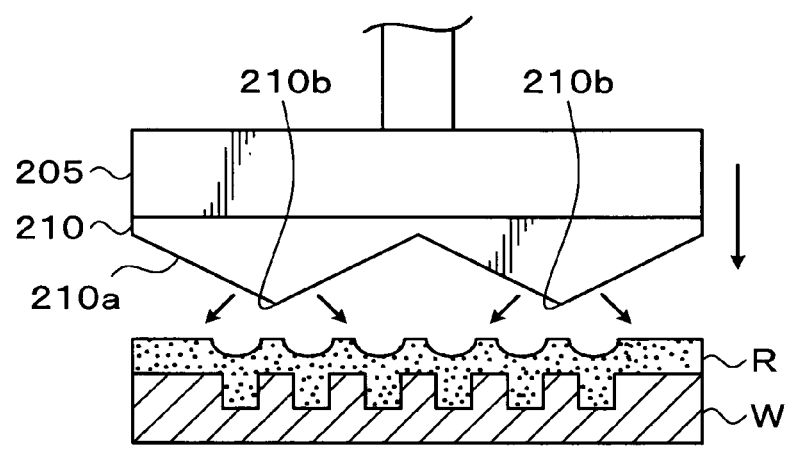
FIG. 9 is an explanatory view showing forces acting when a pressing plate with apex portions presses the resist film.
Figure 10:
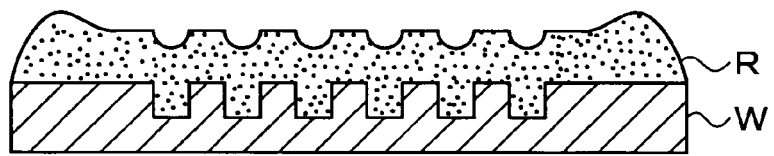
FIG. 10 is an explanatory view showing an appearance of the resist film having irregularities formed on its upper surface.

In planarization processing, supply of the solvent vapor from the gas supply port 220 and exhaust gas from the exhaust port 223 are performed as in the above-described embodiment, so that a solvent atmosphere at a predetermined concentration is maintained in the treatment container 190. For example, an about 60%-dried wafer W is then carried into the treatment container 190 and held on the holding table 200. The wafer W is heated by the heater 203 in the holding table 200, for example, at the first stage temperature $K_1$, as in the above-described embodiment shown in FIG. 5. The pressing plate 210 is then lowered so that the upper surface of the resist film is pressed (a first press). In this event, the resist film R receives forces in the vertical direction and in the horizontal direction by inclined surfaces forming the apex portions 210b as shown in FIG. 9. This accelerates flow of the resist film R in the horizontal direction.

When the pressurization by the pressing plate 210 is finished, the wafer W is carried to and held on the holding table 201 adjacent thereto. The wafer W can be heated by the heater 203 in the holding table 201, for example, at the second stage temperature $K_2$. The pressing plate 211 is then lowered so that the upper surface of the resist film is pressed (a second press). The press this time further flattens the upper surface of the resist film since the pressing plate 211 has the lower surface flatter than that of the pressing plate 211 for the first press.

When the pressurization by the pressing plate 211 is finished, the wafer W is carried to and held on the holding table 202 adjacent thereto. The wafer W can be heated by the heater 203 in the holding table 202, for example, at the third stage temperature $K_3$. The pressing plate 212 is then lowered so that the upper surface of the resist film is pressed (a third press). The pressurization flattens the upper surface of the resist film since the lower surface 212a of the pressing plate 212 is flat. At this point in time, the drying degree of the resist film is about 80%.

For example, during the press by the pressing plate 212, the heating temperature is changed to the fourth stage temperature $K_4$ by the heater 203 in the holding table 202. After the press by the pressing plate 212, the wafer W is heated at the fourth stage temperature $K_4$ to be dried to a drying degree of 100%.

According to this embodiment, the pressing members 210 and 211 having the lower surfaces with the apex portions can press the upper surface of the resist film and thereby accelerate the flow of the resist film in the horizontal direction. This can effectively flatten the irregularities of the resist film. Further, the pressing members having gradually increasing flatnesses press the upper surface of the resist film, thereby making it possible to gradually flatten the upper surface of the resist film while accelerating the flow of the resist film in the horizontal direction, so as to finally form a resist film with a high flatness.

While the three pressing plates 210 to 212 perform three presses respectively in this embodiment, the number of pressing plates and the number of times of press can be arbitrarily selected. Further, while the three holding tables 200 to 202 and the pressing plates 210 to 212 are arranged side by side, three pressing plates may be provided in a changeable manner for one holding table. Furthermore, it is also possible in this embodiment that evaporation of the solvent is not realized by heating but by reduction in pressure as in the above-described embodiment.

Preferred embodiments of the present invention have been described above with reference to the accompanying drawings, but the present invention is not limited to the embodiments. It should be understood that various changes and modifications are readily apparent to those skilled in the art within the spirit as set forth in claims, and those should also be covered by the technical scope of the present invention. For example, the above embodiments are for planarizing the resist film, but the present invention is applicable also to planarization of other kinds of coating films, for example, insulating films such as an SOD film, an SOG film, and so on. Besides, the coating method of the film is not limited to the spin coating method in which the wafer W is coated while it is being rotated, but may be a scan coating method in which the wafer W is coated while a nozzle discharging a coating solution and the wafer W are being relatively moved. Further, the present invention is applicable to planarization of a coating film on substrates other than the wafer W, such as an FPD (Flat Panel Display), a mask reticule for a photomask, and a chip substrate.

The present invention is useful in sufficiently planarizing and drying a coating film on a substrate.

What is claimed is:

1. A processing apparatus for a substrate on which a coating film is formed by application of a coating solution, comprising:
   a holding member for holding the substrate thereon in a treatment container;
   a heating member for heating the substrate held on said holding member;
   a plurality of pressing members for pressing the coating film on the substrate from above; and
   a controller for controlling operations of said heating member and said plurality of pressing members so that said plurality of pressing members intermittently press an upper surface of the coating film on the substrate heated by said heating member,
   wherein said plurality of pressing members comprise a first pressing member having an apex portion protruding downward on a lower surface thereof and a second pressing member having a flat lower surface, and
   wherein said controller conducts control such that said first pressing member having an apex portion presses the upper surface of the coating film on the substrate and then said second pressing member having a flat lower surface presses the upper surface of the coating film.

2. The substrate processing apparatus as set forth in claim 1,
   wherein said plurality of pressing members comprise a plurality of pressing members different in height of the apex portion, and
   wherein said controller controls said plurality of pressing members such that said plurality of pressing members press the upper surface of the coating film in order from said first pressing member having a higher apex portion and said second pressing member having a flat lower surface finally presses the upper surface of the coating film.

3. The substrate processing apparatus as set forth in claim 1, further comprising:
   a solvent vapor supply unit for supplying a vapor of the solvent for the coating film into said treatment container.

4. The substrate processing apparatus as set forth in claim 3,
   wherein said controller control operation of the solvent vapor supply unit such that the solvent vapor supply unit supply the vapor of the solvent for the coating film to an atmosphere around the substrate during the heating of the substrate.

5. The substrate processing apparatus as set forth in claim 1,
   wherein said controller control operation of the plurality of pressure members such that said plurality of pressing members intermittently presses an upper surface of the coating film on the substrate when a drying degree of the coating film is 60% to 80%.

6. The substrate processing apparatus as set forth in claim 1,
   wherein said controller control operation of the heating member such that the heating member gradually raised a heating temperature at the time of heating the substrate.

7. The substrate processing apparatus as set forth in claim 6,
   wherein the heating temperature is raised when the coating film on the substrate is being pressed.

8. A processing apparatus for a substrate on which a coating film is formed by application of a coating solution, comprising:
- a holding member for holding the substrate thereon in a treatment container;
- a pressure reducing unit for reducing a pressure in said treatment container;
- a plurality of pressing members for pressing the coating film on the substrate held on said holding member from above; and
- a controller for controlling operations of said pressure reducing unit and said plurality of pressing members such that said plurality of pressing members intermittently press an upper surface of the coating film on the substrate while said pressure reducing unit is reducing the pressure in said treatment container,
- wherein said plurality of pressing members comprise a first pressing member having an apex portion protruding downward on a lower surface thereof and a second pressing member having a flat lower surface, and
- wherein said controller conducts control such that said first pressing member having an apex portion presses the upper surface of the coating film on the substrate and then said second pressing member having a flat lower surface presses the upper surface of the coating film.

9. The substrate processing apparatus as set forth in claim 8,
- wherein said pressure reducing unit reduce a pressure around the substrate.

10. The substrate processing apparatus as set forth in claim 9,
- wherein said controller control operation of the pressure reducing unit such that pressure reducing unit gradually increase a degree of pressure reduction at the time when the pressure around the substrate.

11. The substrate processing apparatus as set forth in claim 10,
- wherein the degree of pressure reduction is increased when the coating film on the substrate is being pressed.

* * * * *